United States Patent
Benzing et al.

(12) 
(10) Patent No.: US 6,528,153 B1
(45) Date of Patent: Mar. 4, 2003

(54) LOW DIELECTRIC CONSTANT POROUS MATERIALS HAVING IMPROVED MECHANICAL STRENGTH

(75) Inventors: Jeffrey C. Benzing; John Kelly, both of San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/409,762

(22) Filed: Sep. 30, 1999

(51) Int. Cl.$^7$ ................................................. B32B 3/00
(52) U.S. Cl. ............................... 428/307.3; 428/311.51; 428/319.3; 427/430.1
(58) Field of Search ........................... 428/304.4, 307.3, 428/309.9, 315.5, 319.3, 311.51; 257/3, 642, 643, 752, 758, 759; 438/700, 702, 704; 427/430.1

(56) References Cited

U.S. PATENT DOCUMENTS

| | | | |
|---|---|---|---|
| 5,470,802 A | * 11/1995 | Gnade et al. | |
| 5,494,858 A | 2/1996 | Gnade et al. | ................ 437/231 |
| 5,536,321 A | 7/1996 | Olsen et al. | ................ 118/719 |
| 5,538,758 A | 7/1996 | Beach et al. | ............. 427/255.6 |
| 5,569,058 A | * 10/1996 | Gnade et al. | |
| 5,709,753 A | 1/1998 | Olson et al. | ................ 118/719 |
| 5,807,607 A | 9/1998 | Smith et al. | ................... 427/96 |
| 5,847,443 A | * 12/1998 | Cho et al. | |
| 5,885,843 A | 3/1999 | Ayers et al. | ................ 436/136 |
| 5,916,365 A | 6/1999 | Sherman | ..................... 117/92 |
| 6,008,540 A | * 12/1999 | Lu et al. | |
| 6,030,381 A | * 2/2000 | Jones et al. | .................... 606/33 |
| 6,090,724 A | * 7/2000 | Shelton et al. | .............. 438/624 |
| 6,096,655 A | * 8/2000 | Lee et al. | |
| 6,222,269 B1 | * 4/2001 | Usami | |
| 6,297,539 B1 | 10/2001 | Ma et al. | .................... 257/410 |
| 6,318,124 B1 | * 11/2001 | Rutherford et al. | ......... 427/165 |

OTHER PUBLICATIONS

M. Jo, et al., "Evaluation of $SiO_2$ aerogel thin film with ultra low dielectric constant as an intermetal dielectric", Microelectronic Engineering 33, pp. 343–348 (1977).

L. Hrubesh, "Silica Aerogel: An Intrinsically Low Dielectric Constant Material", Mat. Res. Soc. Symp. Proc., vol. 381, pp. 267–272 (1995).

P. Brüsch, et al., "Electrical and Infrared Dielectrical Properties of Silica Aerogels and of Silica–Aerogel–Based composites", Appl. Phys., A 57, pp. 329–337 (1993).

Lakomaa, et al., "Atomic layer growth of $TiO_2$ on silica", Applied Surface Science 60/61, pp. 742–748, 1992.

Ott, et al., "Atomic layer controlled deposition o f $Al_2O_3$ films using binary reaction sequence chemistry", Applied Surface Science 107, pp. 128–136, 1996.

Suntola, et al., "Atomic Layer Epitaxy", Ann. rev. Mater. Sci, pp. 177–194, 1995.

George, et al., "Surface Chemistry for Atomic Layer Growth", J. Phys. Chem., pp. 13121–13131, 1996.

Nitta, et al., "Surface modified spin–on xerogel films as interlayer dielectrics", J. Vac. Sci. Technol. B 17(1), pp. 205–212, Jan./Feb. 1999.

Fricke, et al., "Aerogels–Preparation, Properties, Applications", Structure and Bonding, pp. 38–79, 1992.

(List continued on next page.)

Primary Examiner—Terrel Morris
Assistant Examiner—Leanna Roché
(74) Attorney, Agent, or Firm—Skjerven Morrill LLP

(57) ABSTRACT

The present invention relates to porous materials, typically xerogels or aerogels, having a low dielectric constant but relatively poor mechanical strength. The present invention relates to polymeric coatings, preferably parylene, coated on inorganic xerogels or aerogels so as to increase the mechanical strength while not substantially degrading the dielectric properties of the resulting coated material. Silica xerogel conformally coated with parylene AF-4 is described.

19 Claims, 1 Drawing Sheet

OTHER PUBLICATIONS

Hunt, et al., "Aerogel composites using chemical vapor infiltration", Journal of Non–Crystalline Solids 185, pp. 227–232, 1995.

Russo, et al., "Comparison of Ethyl Versus Methyl Sol–Gels For Silica Aerogels Using Polar Nephelometry", Journal of Non–Crystalline Solids 86, pp. 219–230, 1986.

Haereid, et al., "Thermal and temporal aging of TMOS–based aerogel precursors in water", Journal of Non–Crystalline Solids 185, pp. 221–226, 1995.

Smith, et al., "Preparation of Low–Density Xerogels At Ambient Pressure For Low K Dielectrics", Mat. Res. Soc. Symp. Proc. vol. 371, pp. 261–266, 1995.

Smith, et al., "Preparation of Low–Density xerogels at ambient pressure", Journal of Non–Crystalline Solids 186, pp. 104–112, 1995.

Plano, et al., "The Effect of Deposition Conditions On The Properties of Vapor–Deposited Parylene AF–4 Films", Mat. Res. Soc. Symp. Proc. vol. 476, pp. 213–218, 1997.

Ralston, et al., "Integration of Thermally Stable, Low–k AF4 Polymer for 0.18 $\mu$m Interconnects and beyond", Symposium on VLSI Technology, 2 pages, Jun. 10–12, 1997.

Hya, et al., "Structural analysis of silica aerogels", Journal of Non–Crystalline Solids 186, pp. 142–148, 1995.

Hunt, et al., "Process Considerations In Monolithic Aerogels", Mat. Res. Soc. Symp. Proc. vol. 121, 4 pages, 1988.

Schmidt, "Thin Films, the Chemical processing up to Gelation", Structure and Bonding, vol. 77, 19 pages, 1992.

Brinker, et al., "Sol–Gel Transition In Simple Silicates", Journal of Non–Crystalline Solids 48, pp. 47–64, 1982.

Paulaitis, et al., "the Preparation of Acid–Catalyzed Silica Aerogel", Chemical Engineering at Supercritical Fluid Conditions, pp. 445–461, May 1995.

Ramos, et al., "Nonoporous Silica for Low K Dielectrics", Mat. Res. Soc. Symp. Proc. vol. 443, pp. 91–98, 1997.

San Teh Coating Technology PTE LTD, "Parylene Process", http:///www.stct.com.sg/process.htm.

Schubert, "Organically Modified Silica Aerogels form Rsi(OR')$_3$/Si(OR')$_4$ Mixtures", Chem Mater, pp. 263–272, 1995.

* cited by examiner

LOW DIELECTRIC CONSTANT POROUS MATERIALS HAVING IMPROVED MECHANICAL STRENGTH

SUMMARY OF THE INVENTION

The present invention relates to porous materials, typically xerogels or aerogels, having a low dielectric constant but having a disadvantage of relatively poor mechanical strength. The present invention also relates to polymeric coatings, preferably parylene, coated on inorganic xerogels or aerogels so as to increase the mechanical strength while not substantially degrading the dielectric properties of the resulting coated material. Silica xerogel conformally coated with parylene AF-4 is described. An advantage of the present invention is to provide a low dielectric material having increased mechanical strength in comparison with the uncoated porous material, as would be advantageous in the fabrication of semiconductor electronic devices.

BACKGROUND OF THE INVENTION

1. Technical Field

This invention relates generally to low dielectric constant porous materials and, more particularly, to porous materials conformally coated with polymeric materials for enhanced mechanical strength as well as low dielectric constant.

2. Description of Related Art

Porous materials have been used for a variety of applications including thermal insulators, heat storage systems, acoustic damping materials, and electrical insulators. In recent years, there has been particular interest in developing porous materials as insulators for use in semiconductor devices.

As feature sizes in integrated circuits are decreased to 0.18 µm and below, problems related to signal delay, power consumption, and crosstalk become increasingly significant. Signal delay arises because the RC time constant of the materials becomes increasingly significant as interconnect linewidths and spacings have shrunk. Miniaturization also generally results in increased crosstalk or capacitive coupling between nearby conductors. One possible means for reducing the RC time constant and the capacitive coupling is to decrease the capacitance between the conductors. Since the capacitance between two conductors increases substantially in proportion to the dielectric constant of the medium separating them, this can be achieved by using a dielectric material with reduced dielectric constant separating the conductors.

Silicon dioxide ($SiO_2$) has long been used in integrated circuits as the primary insulating material. With a dielectric constant of approximately 4, $SiO_2$ has been an acceptable intermetal dielectric for many years. With the continuing shrinkage in film thickness and intermetal spacings, the $SiO_2$ dielectric constant of 4.0 is now too high for optimum operation of high speed integrated circuits such as MPUs. One means for achieving a dielectric material with a lower dielectric constant than $SiO_2$ is to use certain organic or polymeric materials. However, such materials tend to have limited thermal stability and mechanical strength. A number of materials are known to have dielectric constants around 2.6, such as polymers known commercially as SILK, FLARE and HOSP. Others such as parylenes have dielectric constants down to 2.24 (Parylene AF-4), and other variants are being tested which may have even lower dielectric constants. TEFLON, or related fluoropolymers are known to have dielectric constants down to approximately 1.7. However, because of their poor thermal and mechanical properties they are extremely hard to use in the manufacture of integrated circuits, where temperatures of 400 C. to 425 C. are normally encountered during subsequent processing steps. The dielectric constant of vacuum or dry air is about 1.0. Thus, one way to obtain a material with a low dielectric constant is to use a porous or sparse, low density material in which a significant fraction of the bulk volume consists of space or air. Other gases having low dielectric constant may also be acceptable. The effective dielectric constant will be determined by the combination of the dielectric constants of air and the porous material (or materials) and lie somewhere between the dielectric constants of air and the largest dielectric constant of the bulk material(s). Porous materials may be fabricated in many different structural forms with many different compositions. Therefore, such materials offer the possibility of achieving a low dielectric constant and having composition and/or structural features resulting in acceptable mechanical, thermal, electrical and chemical properties.

A low effective dielectric constant may be achieved by means of a porous structure in which a large fraction of the volume consists of space or low dielectric gas. However, it is not inherently necessary that such structures be open to the free flow of gas. Closed cell structures containing designed spaces containing vacuum or low dielectric constant gas, not open to free flow of gas throughout the structure, also achieve low dielectric constants.

One class of porous materials is foams. Typically, foams are made by producing a structure of the material and blowing air or other gases through the structure to create voids or by liberating gas throughout the material to create cells or pockets. Foams may be useful as thermal insulators and energy absorbers. However, the voids are typically on a macroscopic scale too large to be used in semiconductor devices with sub-micron characteristic feature sizes.

Another class of porous material that has been extensively investigated is sol-gel derived materials termed xerogels or aerogels. Sol-gel synthesis of oxide materials is typically based upon the hydrolysis and condensation of alkoxides $M(OR)_n$ where M is typically a metal atom (Si, Ti, Al, etc.) and R is typically an alkyl group. A common precursor for $SiO_2$ xerogels and aerogels is tetraethoxysilane ("TEOS"), when M=Si, R=$C_2H_5$ and n=4.

Aerogels of main group oxides, and of transition and semimetal oxides, as well as carbon aerogels and aerogels of organic compounds, have been produced. Aerogels consist of molecular sized clusters which are connected in such a way that a three dimensional structure is formed resembling a microscopic "string of pearls." The rigid skeleton of the aerogel may occupy only a very small fraction of the total volume.

The most thoroughly studied xerogel system is probably silica, that is xerogels derived from silicon dioxide. As described, for example, in L. Hrubesh, Mat. Res. Soc. Symp. Proc. 381, p. 267 (1995) and in Fricke et al., Structure and Bonding 77, p. 37 (1992), silica xerogels are typically prepared by the controlled hydrolysis and condensation of a silicon alkoxide precursor such as tetraethoxysilane (TEOS), equivalently named tetraethylorthosilicate. A precursor solution of TEOS, alcohol, water, and an acid and/or base catalyst is typically mixed together. Hydrolysis and condensation first results in a "sol" defined as a solution of polymeric or colloidal materials. The colloidal materials continue to agglomerate to form a "gel". A gel is generally defined as a material composed of two phases, generally having a three-dimensional network of solid material with spaces within the network occupied by a liquid.

The next step in preparing a silica xerogel or aerogel is typically to dry the liquid or alcohol-filled gel without collapsing the structure. One method for drying the gel while avoiding the formation of a liquid-vapor meniscus is the method of supercritical extraction (also called "hypercritical extraction"). This method avoids the creation of a liquid-vapor interface by the utilization of supercritical conditions of temperature and pressure during the solvent extraction process. Such conditions avoid surface tension forces and the collapse of the material due to the surface tension. Carbon dioxide is typically used for supercritical extraction since the critical point occurs at convenient values of temperature and pressure. However, the use of other solvents such as water is not inherently excluded. The material formed by supercritical extraction of the solvent is termed an aerogel.

Another technique for drying the gel while reducing surface tension forces makes use of evaporation, often preceded by a solvent exchange to achieve a reduction in surface tension forces during evaporation. One way to accomplish this is to perform a solvent exchange with a solvent that replaces the OH groups of the gel, but presents a hydrophobic surface when so bonded (or repulsive to the solvent if a non-aqueous solvent is employed). This reduces the solvent binding to the gel surface such that surface tension of the solvent does not substantially affect the structure of the gel during evaporation. Solvent exchange typically works best when employed in connection with thin film gels. The material produced in this way is generally termed a xerogel. The distinction between an aerogel and a xerogel lies in the processing method rather than in the final structure of the material. For economy of language we will use the term "xerogel" herein to refer to either xerogel or aerogel intending thereby that the present invention does not inherently exclude either procedure for forming the porous material. The present invention is independent of the formation processes leading to the particular porous material, xerogel or aerogel.

The potential utility of porous silica as a low dielectric constant insulating material has been recognized. (See, for example, Hrubesh (supra), Ramos et al. Mat. Res. Soc. Symp. Proc. 443, p. 91 (1997), and U.S. Pat. Nos. 5,470,802, 5,569,058, and 5,847,443.) However, as described by Ramos et al., (supra) for example, although porosity leads to a lower dielectric constant as compared with the corresponding dense material, certain disadvantages also arise. In particular, a tradeoff between dielectric constant and mechanical strength has been recognized. As a material is made more porous, the dielectric constant is decreased, but at the cost of a decrease in mechanical strength.

Another disadvantage of silica xerogels is their sensitivity to moisture. The inner surface of silica xerogels is very polar due to residual hydroxy or alkoxy groups bonded to silicon, which promotes adsorption of water. Chemical methods to modify this property by modifying the sol-gel synthesis method have been described by Schubert in *Tailor-made Silicon-Oxygen Compounds,* R. Corriu (Friedrich Vieweg & Sohn, 1996) pp. 263. However, this approach does not address the problem of mechanical fragility of porous materials. Another method to modify xerogel properties, using chemical vapor infiltration, in which a reactive gas is flowed through an xerogel placed in a furnace, has been described by Hunt et al., J. Non-cryst. Solids, 185, p.227 (1995). However, chemical vapor infiltration is described as resulting in new composite materials. These new composite materials may not retain the porosity of the original xerogel.

A way is needed to increase the mechanical strength of porous materials while retaining the advantageous low dielectric constant and other properties of these materials. Furthermore, for porous dielectric materials, it would be desirable if the method of increasing mechanical strength were readily integrated with standard semiconductor fabrication processes.

The approach taken in the present invention is to coat the porous material with a thin film of polymeric material to enhance mechanical strength while not unacceptably increasing the dielectric constant.

BRIEF DESCRIPTION OF THE DRAWINGS

The figures herein are not to scale.

DETAILED DESCRIPTION OF THE INVENTION

In the following description and figures, similar reference numbers are used to identify similar elements.

Porous materials, and in particular, films of porous materials, can be produced by a variety of processes. One representative process is the sol-gel process for producing a silica xerogel film on a wafer. As described, for example, in Nitta et al., J. Vac. Sci. Technology B 17(1), 205 (1999), a silica xerogel is prepared by the hydrolysis and condensation of alkoxysilanes. Tetraethoxysilane (TEOS) is hydrolyzed by reacting with water in the presence of an alcohol solvent, typically ethanol, and in the presence of HCl as an acid catalyst. The acid catalyzed solution is mixed with a base catalyst such as ammonium hydroxide. Immediately following base catalysis, the solution is filtered and spin-deposited on a clean silicon wafer. A solvent-saturated atmosphere is maintained during the spin deposition. In the early process after deposition, the spun-on film is gelled for 45 minutes on the spin coater and aged. After aging, surface modification and solvent exchange is performed by immersing the aged film in a solution of hexane and trimethylchlorosilane. The film is furnace dried in a dry air or nitrogen atmosphere. Other methods for producing porous materials are also known in the art.

Figure 1A:
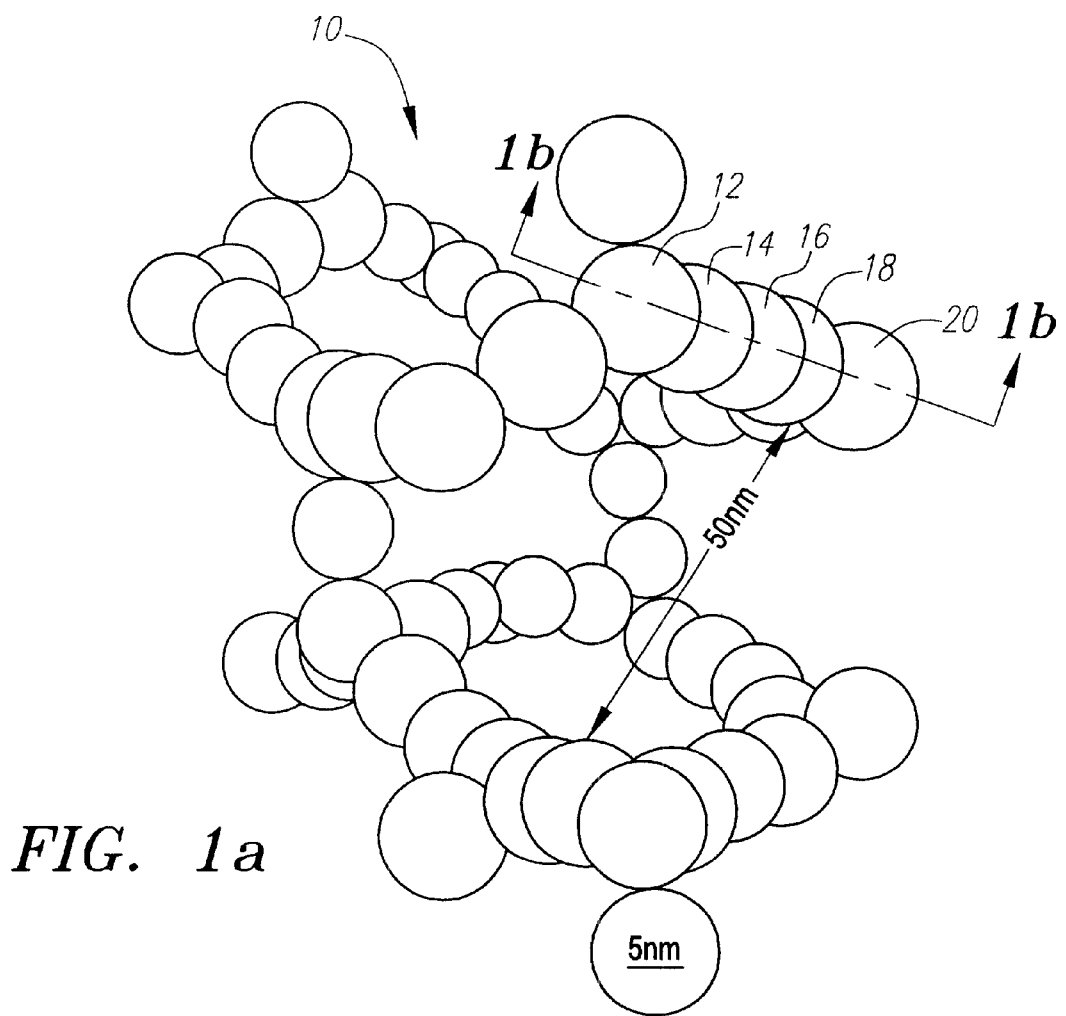
FIG. 1a: Schematic perspective depiction of porous xerogel material.
Figure 1B:
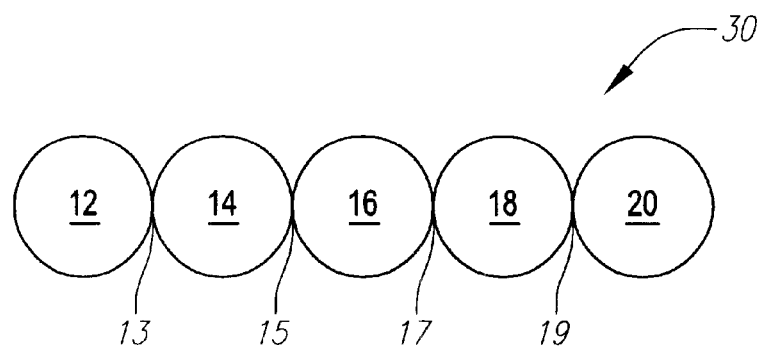
FIG. 1b: Schematic depiction of linear arrangements of xerogel particles.

A silica xerogel is a porous material composed of molecular sized clusters connected to form a three dimensional skeleton that has a fibrous structure. FIGS. 1a and 1b provide a schematic representation of such a xerogel, 10, including molecular sized clusters 12, 14, 16, 18, and 20, which together constitute a fiber 30. The strength of the material is essentially controlled by the number of fibers, the degree of branching of the fibers and the strength of the individual fibers. Stronger structures typically have more fibers and more branches at the expense of a loss of porosity. As depicted in FIG. 1b, the fibers consist of clusters joined together. The clusters 12, 14, 16, 18, and 20 are typically significantly larger in diameter than the joints 13, 15, 17, and 19 between the clusters. The strength of the resulting material is largely controlled by the strength of the joints and the density of fibers and branches. However, for a given density of xerogel, increasing the strength of the joints, 13, 15, etc. increases the overall mechanical strength of the material.

Although the particular example of a silica xerogel was presented above, xerogel, 10, can be alternatively be composed of alumina, zirconia, or a variety of main group oxides and transition metal and semi-metal oxides, as described, for example, in Fricke et al (supra). The coating processes and compositions described herein are not inherently limited to a particular structure or composition of xerogel.

According to an embodiment of the present invention, the strength of the porous material, 10, is increased by changing the structure of the fibers, such as fiber 30, that make up the material structure. The diameter of the fiber is dominated by the diameter of the clusters or "beads" 12, 14, etc. The strength of the fiber (for a fixed density of xerogel) is largely determined by the strength of the joint regions, 13, 15, etc. The strength of such joint regions is determined primarily by the intrinsic strength of adhesion between beads (per unit surface area) and the surface area of bead-bead (inter-bead) contact. The approach of the present invention is to increase the inter-bead joint strength by depositing a film of a strengthening material over the joint regions. In practice, the material coats the entire fiber, 30, including the joint regions but the diameter of the clusters is typically increased by the coating film by a fractionally insignificant amount. However, the coating film will typically increase the diameter of the joint regions by a relatively large fractional amount when compared to the uncoated inter-bead joints. Thus, the strength of the joint regions is increased by the strength of the film, which may be a significant amount.

The present invention relates to the coating of porous materials such as xerogels by a polymeric film. Preferably, the material forming the film should penetrate throughout the structure of the xerogel for good coating of all fibers. This may be done by deposition of the film material onto the xerogel fibers or by means of inducing the chemical processes forming the film to occur substantially on the surface of the fibers and not elsewhere.

An object of the present invention is to achieve improved mechanical strength of xerogel dielectric materials while not seriously degrading (increasing) the dielectric constant. Since the coating material will typically have a dielectric constant higher than that of air, it is desirable to keep the coating thin. However, the strength will increase progressively with thicker coatings, achieving a maximum when the structure is totally filled. This means in practice using the smallest feasible amount of coating material that will provide the necessary strength enhancement. Since the coating will displace air, a thicker coating will necessarily increase the overall dielectric constant of the air-xerogel-film composition. However, the present invention makes use of conformal coating as an achievable coating process in practice. Conformal coating need not add substantially to the fractional thickness of the beads but significantly strengthens the joints and walls.

The coating material should have as small a dielectric constant as practical so its presence only modestly increases the overall dielectric constant of the system. The coating film should not have undesirable mechanical, thermal, electrical or chemical properties for the environment in which the coated xerogel is to be used, typically integrated circuits.

Parylene is a generic name for a family of poly p-xylylene polymers which are typically deposited by CVD p-xylylene monomer. The polymers are generally known as "living polymers" because of the continuing activity at the ends of the polymer chains which can extend during subsequent depositions. The monomer is typically generated by pyrolysis from a dimer of the type shown in Eq. 1. The most commonly available dimer is parylene-n in which X is hydrogen. Many other versions exist in which one or more of the X's may be substituted by chlorine, fluorine or cyano groups. A particularly advantageous form is known as poly (σ,σ,σ,σ-tetrafluoro-p-xylylene) of AF-4, which has 4 substituted fluorine atoms in the polymer cell (8 in the dimer).

Eq. (1)

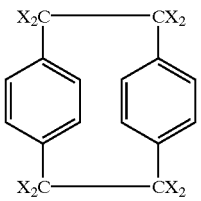

Typical parylene precursor with X = hydrogen, halogen.
X = H (di-p-xylylene) yields parylene N on polymerization
X = F yields parylene AF-4

In addition to parylene N and AF-4 depicted in Eq. (1), other forms of parylene known in the art include parylene C, parylene D, cyanoparylene, etc.

Parylene is a family of polymeric coatings having a reasonably low dielectric constant (in the range of 2.0 to 2.6, e.g. AF-4 is 2.24 at 1 MHz) that has been tested as an intermetal dielectric in the fabrication of integrated circuits. Coating of parylene onto wafers and other substances is known in the art (for example, see Plano et. al. Mat. Res. Soc. Symp. Proc. Vol. 476, pp. 231 (1997), Olson et. al. U.S. Pat. No. 5,709,753 and references cited therein).

Parylene coatings are typically obtained from the dimer precursor of Eq. (1) by vaporization of the crystalline dimer precursor followed by pyrolysis into the monomer form while in the vapor. The monomer in the vapor phase is typically fed to a deposition chamber in which the monomers deposit on the surface of the substrate to be coated within the deposition chamber (e.g. the xerogel). Polymerization occurs on the surface forming the parylene film. This reaction sequence is depicted in Eq. (2) for parylene AF-4.

Eq. (2)

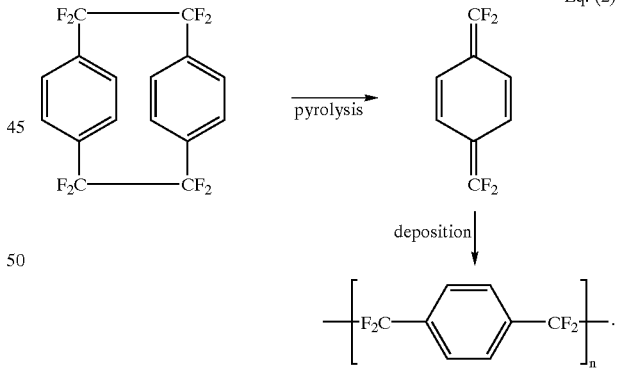

EXAMPLES

Xerogel Preparation

There are a variety of processes for making a porous xerogel film. The present inventors produced a porous xerogel silica film substantially as carried out by Nitta et. al. (supra). Although the practice of the present invention is described herein in terms of a silica xerogel film, other types of base films (such as aerogel) are also suitable for use with the coating of the present invention. The present invention is not limited to silica as a base material and can readily be practiced with other xerogel (or aerogel) base materials such as alumina, zirconia, etc.

The typical process of xerogel preparation consists of six basic steps: (1) acid catalysis, (2) base catalysis, (3) spin coating, (4) gelation and aging, (5) surface modification, and (6) drying.

The acid catalyzed sol preparation is typically carried out by reacting a mixture of tetraethoxysilane (TEOS), water and HCl at 60° C. for 90 minutes using ethanol as a solvent. A molar ratio of reactants may be used in the proportion (TEOS, water, ethanol, HCl) as (1:2: 3.8: $7.3 \times 10^{-4}$). The base catalysis is typically carried out by mixing 10 ml of the acid catalyzed solution with 1 ml of 0.05 M ammonia.

Immediately following base catalysis, the solution is typically filtered and deposited on a clean wafer surface in a spinning apparatus. The sol may be spun at about 2000 rpm for about 12 seconds. A solvent-saturated atmosphere is typically maintained during the spinning in order to reduce evaporation rate.

Following spinning, the wafer is typically left in the spinner for a period of time (for example, 45 minutes) to permit the commencement of gelation and aging. Immediately prior to removal of the wafer from the spinner, 2 ml of a mixture of ammonia and ethanol is typically deposited on the wafer to avoid drying. The wafer may then be transferred to a container of ammonia/ethanol solution and immersed for a period of time, typically at a constant temperature of about 40° C.

Following this aging step, a surface modification (typically silylation) may be performed. The silylation and solvent exchange are typically carried out by immersing the wafer containing the aged silica film in a solution of hexane and approximately 1%–2% trimethylchlorosilane (TMCS) for 60 minutes. The film is then typically dried with dry air or nitrogen in a furnace having gradually increasing temperature. The furnace may be controlled to increase its temperature from 50° C. to 450° C. at a rate of 1° C. per minute (for example).

Parylene Deposition

The starting point for deposition of parylene AF-4 film (in this example) is the crystalline dimer depicted in Eq. (1) with X=F. The chemistry of formation of the parylene AF-4 film is given in Eq. (2). The procedures given herein derive from those of Plano et. al. (supra).

The crystalline solid dimer is vaporized to a pressure of about 100 mT (milliTorr) at a temperature of about 100° C. The resulting vapor is allowed to flow into a pyrolysis chamber maintained at a temperature of approximately 650° C. where the dimer cracks into the monomer tetrafluoro-p-xylylene as depicted in Eq. (2). The monomer vapor is then directed into the deposition chamber which is maintained at a pressure of approximately 20–40 mT. The monomer gas condenses onto a cold surface in the deposition chamber where the polymerization reaction occurs to yield the parylene AF-4 film, as depicted in Eq. (2). The substrate temperature is typically maintained in the range 0° to −20° C. The deposition rate increases with decreasing substrate temperature in this temperature range. Deposition rates of 1000 A are easy to obtain under these conditions and deposition rates up to 1 $\mu$m per minute can readily be achieved. Deposition and coating of xerogels where very thin coatings are required should be performed under conditions of slower deposition than typically used for coating a substantially flat parylene film onto a substrate. In the experiments conducted, temperatures as high as +20 C. were used to slow the deposition rate to a convenient value.

Coated xerogels as described above were prepared. Fourier transform infrared spectroscopy ("FTIR"), Rutherford backscattering spectroscopy ("RBS"), secondary ion mass spectroscopy ("SIMS"), scanning electron microscopy ("SEM"), UV spectroscopy and other conventional techniques of analytical chemistry were used to confirm the coating of parylene AF-4 onto the silica xerogel. Greatly increased mechanical strength was observed in the coated film as determined by the stud-pull test procedure.

Although the invention has been described with reference to particular materials, the description is only an example of the invention's application and should not be taken as a limitation. Various adaptations and combinations of features of the deposited films and porous materials disclosed are within the scope of the invention as defined by the following claims.

Historically, the term "aerogel" has been used to indicate a porous structure in which supercritical drying is employed and "xerogel" when dried by solvent extraction. However, the coating of porous structures as described herein is not intended to be limited by the method of preparation of the porous substrate to be coated. Rather, we use the term "nanoporous material" to denote a porous structure having structure substantially equivalent to that depicted in FIGS. 1a and 1b including historical aerogels and xerogels.

Having described the invention in detail, those skilled in the art will appreciate that, given the present disclosure, modifications may be made to the invention without departing from the spirit of the inventive concept described herein. Therefore, it is not intended that the scope of the invention be limited to the specific and preferred embodiments illustrated and described. Rather, it is intended that the scope of the invention be determined by the appended claims.

We claim:

1. A dielectric material comprising:
   a) a nanoporous material comprising a skeletal structure of interconnected fibers separated by pores; and,
   b) a polymer coated on the surfaces of the fibers generally throughout said nanoporous material without filling said pores, thereby increasing the mechanical strength of said nanoporous material.

2. A dielectric material as in claim 1 wherein said nanoporous material is selected from the group consisting of silica, alumina, zirconia and mixtures thereof.

3. A dielectric material as in claim 1 wherein said polymer is conformally coated.

4. A dielectric material as in claim 1 wherein said polymer has a low dielectric constant.

5. A dielectric material as in claim 4 wherein said polymer is a parylene.

6. A dielectric material as in claim 5 wherein said polymer is parylene AF-4.

7. A semiconductor device comprising at least one insulating medium therein wherein said at least one insulating medium comprises a dielectric material according to claim 1.

8. A semiconductor device as in claim 7 wherein said nanoporous material is selected from the group consisting of silica, alumina, zirconia and mixtures thereof.

9. A semiconductor device as in claim 7 wherein said polymer is conformally coated.

10. A semiconductor device as in claim 7 wherein said polymer has a low dielectric constant.

11. A semiconductor device as in claim 10 wherein said polymer is a parylene.

12. A semiconductor device as in claim 11 wherein said polymer is parylene AF-4.

13. A method of increasing the mechanical strength of a dielectric material comprising:
   a) providing a porous dielectric material, said dielectric material comprising a skeletal structure of interconnected fibers separated by pores; and,
   b) coating the surfaces of the fibers generally throughout said porous material with a polymer without filling said pores, thereby increasing the mechanical strength of said dielectric material.

14. A method as in claim 13 wherein said porous dielectric material is a nanoporous material.

15. A method as in claim 14 wherein said porous material is selected from the group consisting of silica, alumina, zirconia and mixtures thereof.

16. A method as in claim 14 wherein said polymer is conformally coated.

17. A method as in claim 13 wherein said polymer has a low dielectric constant.

18. A method as in claim 17 wherein said polymer is a parylene.

19. A method as in claim 18 wherein said polymer is parylene AF-4.

\* \* \* \* \*